United States Patent [19]
Tanasaleh et al.

[11] Patent Number: 4,995,098
[45] Date of Patent: Feb. 19, 1991

[54] ADAPTIVE SCANNING METHOD

[75] Inventors: Buddy S. Tanasaleh, Arlington; Michael A. Krzystyniak, Haslet, both of Tex.

[73] Assignee: Motorola, Inc., Schaumburg, Ill.

[21] Appl. No.: 240,181

[22] Filed: Sep. 6, 1988

[51] Int. Cl.⁵ .................................... H03J 7/20
[52] U.S. Cl. .......................... 455/165; 455/183; 455/166
[58] Field of Search .............. 455/165, 166, 171, 175, 455/182, 181, 161, 179, 183

[56] References Cited

U.S. PATENT DOCUMENTS

| | | | |
|---|---|---|---|
| 4,409,688 | 10/1983 | Baker | 455/165 |
| 4,498,194 | 2/1985 | Vandegraaf | 455/166 |
| 4,573,210 | 2/1986 | Heck | 455/166 |
| 4,776,037 | 10/1988 | Rozanski, Jr. | 455/166 |

Primary Examiner—Douglas W. Olms
Assistant Examiner—Ralph Smith
Attorney, Agent, or Firm—Wayne J. Egan

[57] ABSTRACT

A method (100) is provided for a radio that is currently monitoring a first frequency f(1) to determine whether carrier activity exists on a second frequency f(2). The radio loads f(2) into the synthesizer (102). After waiting 17 ms (103), the radio makes a first determination (104) whether the synthesizer is locked on f(2). After waiting 17 ms (105), the radio makes a second determination (106) whether the synthesizer is locked on f(2). If the first determination and the second determination are both affirmative (107), the radio determines (120) whether carrier activity exists on f(2). Otherwise, after waiting 17 ms (108), the radio makes a third determination (109) whether the synthesizer is locked on f(2). If the second determination and the third determination are both affirmative (110), the radio determines (120) whether carrier activity exists on f(2). Otherwise, if the third determination is affirmative (111), after waiting 17 ms (112), the radio determines (120) whether carrier activity exists on f(2). Otherwise, if the third determination is negative, the radio postphones (130) determining whether carrier activity exists on f(2).

3 Claims, 1 Drawing Sheet

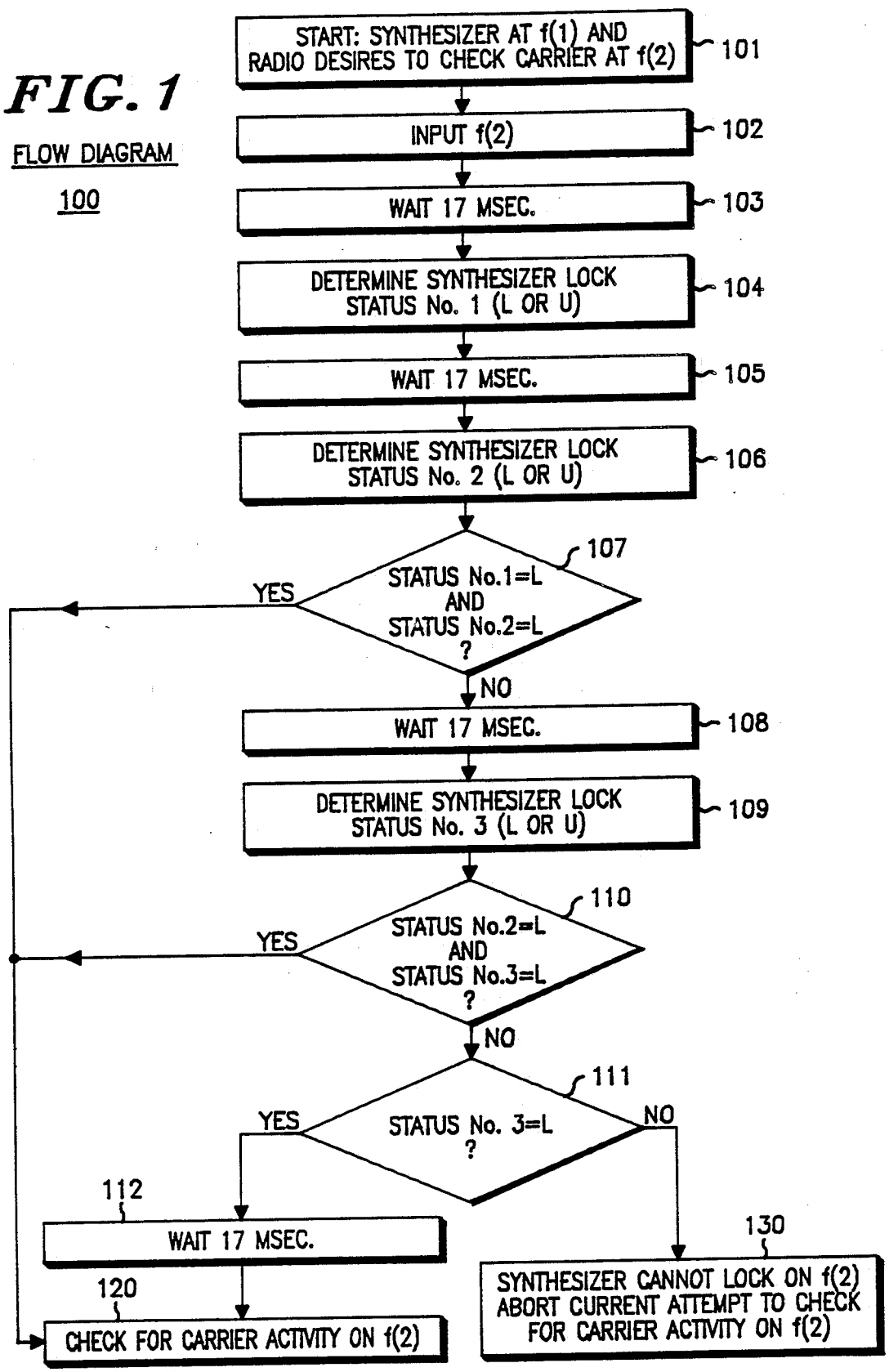

ADAPTIVE SCANNING METHOD

BACKGROUND OF THE INVENTION

This invention pertains to scanning radios, wherein a radio is currently monitoring a first channel of frequency f(1) and desires to check for carrier activity on a second (scanned) channel of frequency f(2).

With present scanning radios using slow-lock synthesizers, the radio waits for a fixed amount of time before checking for carrier activity on the scanned channel. This time is calculated to be sufficient for the worst case of maximum frequency separation between the current channel and the next channel to be scanned. With this arrangement, the radio will leave the active channel frequency f(1) and re-program the synthesizer with the scanned channel frequency f(2). If no carrier activity is detected at frequency f(2), the radio will typically re-program the synthesizer with the prior active channel frequency f(1).

Naturally, this process creates an audible gap in the program on the active channel. For a slow-lock synthesizer, the size of the audible gap is so big that some of the syllables in a verbal communication are missed. Consequently, the conversation being listened to may not be intelligible.

With scanning radios, therefore, it is desirable to minimize the size of the audible gap so that the conversation being monitored is more intelligible.

SUMMARY OF THE INVENTION

Accordingly, it is an object of the present invention to minimize the time required in scanning radios to check for carrier activity on the scanned channel.

The time required to check for carrier activity at the scanned channel is directly related to the time required for the synthesizer to lock on the scanned channel frequency f(2). According to the invention, this time is minimized by determining the synthesizer lock status at several predetermined time intervals, and by determining when to check for carrier activity on the scanned channel based on the lock status observed at these time intervals.

BRIEF DESCRIPTION OF THE DRAWINGS

FIG. 1 depicts a flow diagram for the invention.

DETAILED DESCRIPTION OF THE INVENTION

This invention can be used in conjunction with any appropriate scanning radio, such as the Maratrac radio, manufactured by Motorola, Inc. A description of the operation of the Maratrac radio can be found in manual #68P80102W18-0, available from Motorola, Inc., 1301 E. Algonquin Road, Schaumburg, Ill. 60196. This document is incorporated herein by this reference.

Refer to FIG. 1, where the invention is shown by the flow diagram (100).

The process starts (101) when the radio is currently monitoring a first frequency f(1) and desires to determine the existence of carrier activity on a second frequency f(2). The radio loads frequency f(2) into the synthesizer (102), and waits a first time interval of 17 ms (103). (In practice, this time interval may vary as appropriate according to the specific application. Factors affecting this time period will include the frequency range of the radio, the frequency range of the scanning process, the cycle time of the microprocessor controlling the scanning process, and the synthesizer itself.)

The radio next determines (104) whether the synthesizer has locked on f(2). According to the invention, the result of this determination is a variable designated status #1, with allowable values of locked ("L" in FIG. 1), and unlocked ("U" in FIG. 1).

The radio next waits a second time interval of 17 ms (105), and then again determines (106) whether the synthesizer has locked on f(2). As above, this determination yields a variable status #2 with allowed values of L and U.

The radio now determines (107) whether status #1 equals L AND status #2 equals L. If the answer is affirmative, the radio determines the synthesizer is locked on f(2) and proceeds (120) to check for carrier activity. If the answer is negative, the radio waits (108) a third time interval of 17 ms and then again determines (109) whether the synthesizer has locked on f2. As above, this determination results in variable status #3 with allowed values L and U.

The radio now determines (110) whether status #2 equals L AND status #3 equals L. If the answer is affirmative, the radio determines the synthesizer is locked on f(2) and proceeds (120) to check for carrier activity.

If the answer to this determination (110) is negative, the radio now determines (111) whether status #3 equals L. If the answer is affirmative, the radio waits (112) a fourth time interval of 17 ms and then proceeds (120) to check for carrier activity on f(2). However, if the answer to this determination (111) is negative, the radio determines the synthesizer is currently unable to lock on f(2) and, therefore, the radio aborts (130) its present attempt to check for carrier activity on f(2).

What is claimed is:

1. In a scanning radio receiver having means for detecting carrier activity and having a frequency synthesizer that may be programmed to provide an output signal of a desired frequency and that provides a "lock status" indication when said output signal is stably tuned to said programmed desired frequency, said frequency synthesizer output signal initially being stably tuned to an active frequency, a method for determining the earliest time at which said frequency synthesizer is stably tuned to a scanned frequency so that carrier activity may be detected thereat with the minimum time delay, comprising the following steps:

(1) programming said frequency synthesizer with said scanned frequency:
   (2) after the passage of at least a first predetermined time interval, then determining a first lock status of said frequency synthesizer;
   (3) after the passage of least a second predetermined time interval, then determining a second lock status of said frequency synthesizer:
   (4) when said first lock status and said second lock are both locked, thereupon detecting carrier activity on said scanned frequency:
   (5) otherwise, when at least one of said first lock status and said second lock status is unlocked, and after the passage of at least a third predetermined time interval, then determining a third lock status of said frequency syntheiszer; and,
   (6) when said second lock status and said third lock status are both locked, thereupon detecting carrier activity on said scanned frequency.

2. The method of claim 1 that includes the further step of:
   (7) otherwise, when said third lock status is locked, and after the passage of at least a fourth predetermined time interval, then detecting carrier activity on said scanned frequency.

3. The method claim 2 that includes the further step of:
   (8) otherwise, when said third lock status is unlocked, thereupon aborting the current attempt to detect carrier activity on said scanned frequency.

* * * * *

UNITED STATES PATENT AND TRADEMARK OFFICE
CERTIFICATE OF CORRECTION

PATENT NO. : 4,995,098

DATED : 02/19/91

INVENTOR(S) : Buddy S. Tanasaleh, Michael A. Krzystyniak, William H. Cantrell It is certified that error appears in the above-identified patent and that said Letters Patent is hereby corrected as shown below:

On the title page, item [75] Inventors:
Please insert the name of the third inventor --William H. Cantrell, Haslet, Texas--, which was inadvertently omitted.

Signed and Sealed this

Twenty-second Day of September, 1992

*Attest:*

DOUGLAS B. COMER

*Attesting Officer*     *Acting Commissioner of Patents and Trademarks*